(12) United States Patent
Pfeuffer et al.

(10) Patent No.: US 12,519,088 B2
(45) Date of Patent: Jan. 6, 2026

(54) METHOD FOR PRODUCING RADIATION-EMITTING SEMICONDUCTOR CHIPS, RADIATION-EMITTING SEMICONDUCTOR CHIP AND RADIATION-EMITTING COMPONENT

(71) Applicant: OSRAM Opto Semiconductors GmbH, Regensburg (DE)

(72) Inventors: Alexander F. Pfeuffer, Regensburg (DE); Tobias Meyer, Kelheim (DE); Korbinian Perzlmaier, Regensburg (DE); Thomas Schwarz, Regensburg (DE); Sebastian Hoibl, Kiefersfelden (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 485 days.

(21) Appl. No.: 17/638,710

(22) PCT Filed: Aug. 12, 2020

(86) PCT No.: PCT/EP2020/072652
§ 371 (c)(1),
(2) Date: Feb. 25, 2022

(87) PCT Pub. No.: WO2021/037568
PCT Pub. Date: Mar. 4, 2021

(65) Prior Publication Data
US 2022/0406757 A1 Dec. 22, 2022

(30) Foreign Application Priority Data

Aug. 29, 2019 (DE) .......................... 102019123188.4
Nov. 21, 2019 (DE) .......................... 102019131502.6

(51) Int. Cl.
*H01L 25/075* (2006.01)
*H10H 20/01* (2025.01)
*H10H 20/857* (2025.01)

(52) U.S. Cl.
CPC ......... *H01L 25/0753* (2013.01); *H10H 20/01* (2025.01); *H10H 20/857* (2025.01); *H10H 20/0364* (2025.01)

(58) Field of Classification Search
CPC .. H01L 25/0753; H10H 20/01; H10H 20/032; H10H 20/0364; H10H 20/83; H10H 20/833; H10H 20/856; H10H 20/857
(Continued)

(56) References Cited

U.S. PATENT DOCUMENTS 7,649,193 B2   1/2010   Wirth
9,548,433 B2   1/2017   Illek et al.
(Continued)

FOREIGN PATENT DOCUMENTS

CN      105593991 A     5/2016
DE      102006057747 A1 4/2008
(Continued)

*Primary Examiner* — Fazli Erdem
(74) *Attorney, Agent, or Firm* — Slater Matsil, LLP

(57) ABSTRACT

In an embodiment a method for producing radiation-emitting semiconductor chips includes providing a semiconductor wafer, applying first contact layers on the semiconductor wafer, applying a second dielectric layer on the semiconductor wafer and the first contact layers, attaching a carrier arrangement to the semiconductor wafer, singulating the semiconductor wafer into semiconductor bodies and applying second contact layers on the semiconductor bodies, wherein the second dielectric layer is formed such that it mechanically stabilizes itself.

16 Claims, 13 Drawing Sheets

(58) Field of Classification Search
USPC .......................................................... 257/79
See application file for complete search history.

(56) References Cited

U.S. PATENT DOCUMENTS

| | | | |
|---|---|---|---|
| 9,721,940 | B2 | 8/2017 | Plössl et al. |
| 10,424,509 | B2 | 9/2019 | Eberhard |
| 10,985,292 | B2 | 4/2021 | Hoppel |
| 2007/0267650 | A1* | 11/2007 | Hsieh ................... H10H 20/831 257/E33.057 |
| 2010/0038673 | A1* | 2/2010 | Wirth ................... H10H 20/833 257/98 |
| 2010/0072500 | A1* | 3/2010 | Herrmann .............. H10H 20/82 257/E33.061 |
| 2011/0297972 | A1* | 12/2011 | Seo ..................... H01L 25/0753 257/E33.062 |
| 2013/0299867 | A1 | 11/2013 | Illek et al. |
| 2014/0042466 | A1* | 2/2014 | Hahn ................... H10H 20/833 438/28 |
| 2014/0151724 | A1 | 6/2014 | Herrmann |
| 2016/0181476 | A1 | 6/2016 | Chang et al. |
| 2016/0218097 | A1 | 7/2016 | Plössl et al. |
| 2017/0062679 | A1 | 3/2017 | Lee et al. |
| 2018/0226287 | A1* | 8/2018 | Bower ................ H01L 33/0095 |
| 2019/0096774 | A1 | 3/2019 | Chaji |
| 2019/0229097 | A1 | 7/2019 | Takeya et al. |
| 2019/0229240 | A1* | 7/2019 | Pfeuffer ................ H01L 33/005 |
| 2021/0183834 | A1* | 6/2021 | Rügheimer ......... H01L 33/0095 |

FOREIGN PATENT DOCUMENTS

| | | |
|---|---|---|
| DE | 102010048159 A1 | 4/2012 |
| DE | 102015102374 A1 | 8/2016 |
| DE | 102017104752 A1 | 9/2018 |
| WO | 2012049023 A1 | 4/2012 |

\* cited by examiner

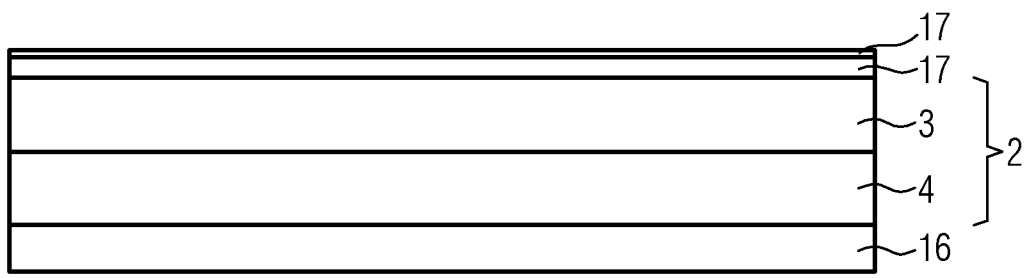
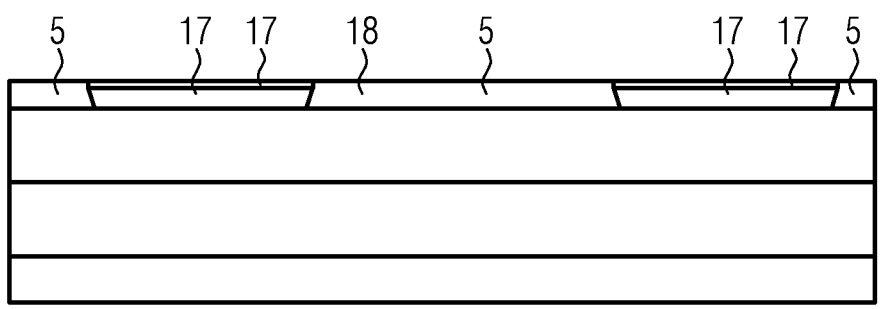
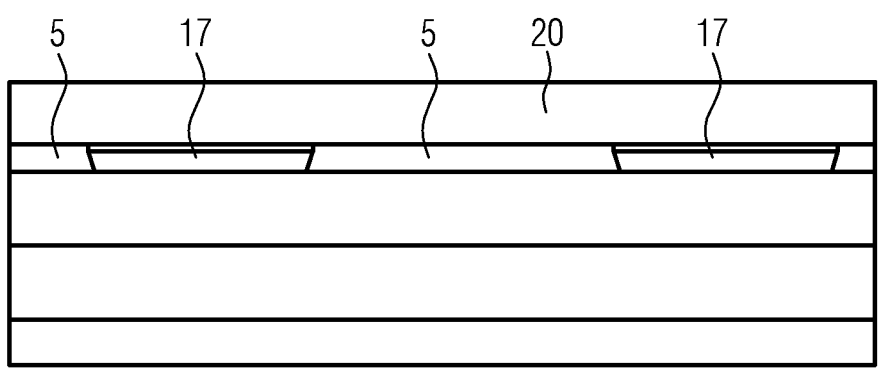

METHOD FOR PRODUCING RADIATION-EMITTING SEMICONDUCTOR CHIPS, RADIATION-EMITTING SEMICONDUCTOR CHIP AND RADIATION-EMITTING COMPONENT

This patent application is a national phase filing under section 371 of PCT/EP2020/072652, filed Aug. 12, 2020, which claims the priority of German patent application 102019131502.6, filed Nov. 21, 2019, which claims the priority of German patent application 102019123188.4, filed Aug. 29, 2019, all of which is incorporated herein by reference in its entirety.

TECHNICAL FIELD

A method for producing radiation-emitting semiconductor chips is specified. Furthermore, a radiation-emitting semiconductor chip and a radiation-emitting device are specified.

SUMMARY OF THE INVENTION

Embodiments provide a method for producing radiation-emitting semiconductor chips, with which radiation-emitting semiconductor chips can be produced particularly cost-effectively. Further embodiments provide a correspondingly manufactured radiation-emitting semiconductor chip and a correspondingly manufactured radiation-emitting device.

According to at least one embodiment of the method, a semiconductor wafer is provided. For example, the semiconductor wafer comprises a first semiconductor layer sequence of a first conductivity type. Further, the semiconductor wafer comprises, for example, a second semiconductor layer sequence of a second conductivity type different from the first conductivity type. The first semiconductor layer sequence is, for example, p-doped and thus p-conductive. Furthermore, the second semiconductor layer sequence is, for example, n-doped and thus n-conductive. Thus, in this case, the first conductivity type is a p-type and the second conductivity type is an n-type.

For example, the semiconductor wafer comprises a main extension plane. A vertical direction extends perpendicular to the main extension plane, and lateral directions extend parallel to the main extension plane. The first semiconductor layer sequence and the second semiconductor layer sequence are stacked on top of each other in the vertical direction, for example. The extension of the semiconductor wafer in the vertical direction is much smaller than the extension in the lateral directions.

At least one active region is arranged between the first semiconductor layer sequence and the second semiconductor layer sequence. The active region is configured to generate electromagnetic radiation during operation. For example, the active region is directly adjacent to the first semiconductor layer sequence and to the second semiconductor layer sequence. The active region comprises, for example, a pn junction, a heterostructure, a single quantum well structure, and/or a multiple quantum well structure.

The electromagnetic radiation generated during operation of the active region is, for example, near-ultraviolet radiation, visible light, and/or near-infrared radiation. For example, the visible light is light of blue, green, yellow, or red color.

For example, the semiconductor wafer is epitaxially grown on a growth substrate. The semiconductor wafer is preferably based on a III-V compound semiconductor material. For example, the III-V compound semiconductor material is a phosphide, arsenide, and/or nitride compound semiconductor material, for example, $In_xAl_yGa_{1-x-y}P$, $In_xAl_yGa_{1-x-y}As$, and/or $In_xAl_yGa_{1-x-y}N$ with $0 \leq x \leq 1$, $0 \leq y \leq 1$, and $x+y \leq 1$.

The semiconductor wafer may comprise dopants as well as additional constituents. For the sake of simplicity, however, only the essential constituents of the crystal lattice of the semiconductor wafer, i.e. Al, Ga, In, N, As or P, are specified, even if these may in part be replaced and/or supplemented by small amounts of further constituents.

According to at least one embodiment of the method, first contact layers are applied onto the semiconductor wafer. The first contact layers are arranged, for example, in a matrix-like manner, i.e. along rows and columns. That is, the first contact layers may be arranged at grid points of a regular grid. For example, the first contact layers are in direct contact with the semiconductor wafer, in particular the first semiconductor layer sequence.

For example, the first contact layers comprise a transparent conductive metal or a transparent conductive oxide (TCO). TCOs are transparent conductive materials and include, for example, zinc oxide, tin oxide, cadmium oxide, titanium oxide, indium oxide, and/or indium tin oxide (ITO).

Alternatively, it is possible that the first contact layers comprise, for example, a reflective, electrically conductive metal. In this case, the first contact layers comprise, for example, one or more of the following materials or consist of one or more of these materials: Au, Ag, Al, Al:Cu, Rh, Pd, Pt. The first contact layers ideally comprise a reflectivity of at least 80%, in particular at least 90%, for the emitting electromagnetic radiation.

According to at least one embodiment of the method, a carrier arrangement is attached to the semiconductor wafer. For example, the carrier arrangement comprises a second carrier layer and a third carrier layer. The second carrier layer is arranged on the semiconductor wafer and covers it completely, for example.

In particular, the second carrier layer comprises an adhesion promoting material or is formed by an adhesion promoting material. The adhesion promoting material can be heated, for example, by means of a laser. As a result, elements applied onto the adhesion promoting material, in particular radiation-emitting semiconductor chips, can advantageously be detached by means of laser radiation in a non-destructive manner.

The second carrier layer can be formed from an at least temporarily flowable material. In this case, the temporarily flowable material comprises, for example, a metallic solder or a benzocyclobutene bond polymer.

Further, a third carrier layer is arranged over the second carrier layer. The third carrier layer is in direct contact with the second carrier layer, for example. In particular, the third carrier layer is an auxiliary carrier that can form a mechanically stabilizing component of the carrier arrangement.

According to at least one embodiment of the method, the semiconductor wafer is singulated to form semiconductor bodies. For example, the semiconductor wafer is singulated into semiconductor bodies by cuts in a vertical direction through the semiconductor wafer. The cuts penetrate the semiconductor wafer in particular completely. The cuts are generated, for example, by a laser process, a sawing process or an etching process.

According to at least one embodiment of the method, second contact layers are applied onto the semiconductor bodies. For example, the second contact layers are in direct contact with the semiconductor body, in particular the second semiconductor layer sequence.

For example, the second contact layers comprise a transparent conductive metal or a transparent conductive oxide (TCO).

Alternatively, it is possible that the second contact layers comprise, for example, a reflective electrically conductive metal. In this case, the second contact layers comprise, for example, one or more of the following materials or consist of one or more of these materials: Au, Ag, Al, Al:Cu, Rh, Pd, Pt. The second contact layers ideally comprise a reflectivity of at least 80%, in particular at least 90%, for the emitted electromagnetic radiation.

It is possible that the first contact layers comprise the same materials as the second contact layers. That is, the first contact layers and the second contact layers are formed by the same TCO material, for example ITO. Further, it is possible that the first contact layers and the second contact layers are formed by, for example, a reflective, electrically conductive metal.

Alternatively, it is possible that the first contact layers comprise a material different from the second contact layers. In this case, the first contact layers may be formed by a reflective, electrically conductive metal and the second contact layers may be formed by a TCO. Furthermore, it is possible that the second contact layers are formed by a reflective, electrically conductive metal and the first contact layers are formed by a TCO.

According to at least one embodiment, an outer surface of the first contact layers facing the semiconductor body and/or an outer surface of the second contact layers facing the semiconductor body is covered, in particular completely, by a further reflective, electrically conductive metal. The further reflective, electrically conductive metal comprises, for example, one or more of the following materials or consists of one or more of these materials: Au, Ag, Al, Al:Cu, Rh, Pd, Pt. The further reflective, electrically conductive metal ideally comprises a reflectivity of at least 80%, in particular at least 90%, for the emitted electromagnetic radiation.

For example, it is possible that the first contact layers and the second contact layers are formed by the same TCO material, for example ITO. In this case, the outer surface of the first contact layers facing the semiconductor body and the outer surface of the second contact layers facing the semiconductor body are completely covered by the further reflective, electrically conductive metal.

If the first contact layers and the second contact layers comprise, for example, a metal, it is further possible that the outer surface of the first contact layers facing the semiconductor body and the outer surface of the second contact layers facing the semiconductor body are covered with the further reflective, electrically conductive metal.

In at least one embodiment, the method for producing radiation-emitting semiconductor chips comprises the steps of:
  providing a semiconductor wafer,
  applying first contact layers onto the semiconductor wafer,
  attaching a carrier device to the semiconductor wafer,
  singulating the semiconductor wafer into semiconductor bodies, and
  applying second contact layers onto the semiconductor bodies.

According to at least one embodiment of the method, after applying the first contact layers, a sacrificial layer which is formed in a single continuous manner is created on the semiconductor wafer. In this embodiment, the sacrificial layer comprises no penetrations. Preferably, a bottom surface and a top surface of the sacrificial layer are unstructured, in particular flat.

According to at least one embodiment of the method, the carrier arrangement comprises a second carrier layer and a third carrier layer. In this embodiment, the second carrier layer and the third carrier layer comprise a bottom surface and a top surface, respectively, which are formed planar.

According to at least one embodiment of the method, the second carrier layer is applied onto the sacrificial layer. In this embodiment, the second carrier layer provides a mechanically stable connection between the sacrificial layer and the third carrier layer.

According to at least one embodiment of the method, after applying the first contact layers, a sacrificial layer is created on the semiconductor wafer, which is penetrated by openings. For example, the sacrificial layer is applied onto the first semiconductor layer sequence.

The sacrificial layer is created by sputtering or vapor deposition, for example. The sacrificial layer comprises, for example, a semiconducting material such as silicon. The sacrificial layer comprises a thickness that is, for example, at least 50 nm and at most 5 µm.

For example, the openings are created in the sacrificial layer after the sacrificial layer is applied. In this case, the openings penetrate the sacrificial layer completely. A material removal for producing the openings in the sacrificial layer can be created by an etching process.

According to at least one embodiment of the method, the carrier arrangement is attached to the sacrificial layer. For this purpose, the carrier arrangement comprises holding elements with which the carrier arrangement is mechanically firmly connected to the semiconductor chips to be produced. The holding elements of the carrier arrangement are created in openings of the sacrificial layer. The carrier arrangement may comprise several layers and/or be created by several method steps. For example, the carrier arrangement comprises a first carrier layer, a second carrier layer, and a third carrier layer.

For example, the first carrier layer is applied over the sacrificial layer. For example, the first carrier layer completely covers the sacrificial layer. Further, the first carrier layer is also arranged in the openings. The openings may each be completely covered with material of the first carrier layer. The material of the first carrier layer in the openings forms the holding elements. For example, the first support layer comprises or is formed from silicon dioxide or aluminum oxide. Further, the first support layer comprises, for example, a thickness of at least 50 nm and at most 500 nm.

Subsequently, a second carrier layer is applied over the first carrier layer, for example. The second carrier layer is in direct contact with the first carrier layer, for example. The second carrier layer comprises, in particular, an adhesion promoting material or is formed by an adhesion promoting material. The adhesion promoting material is formed, for example, by benzocyclobutene or a metallic solder.

The holding elements are formed by portions of the carrier layers arranged in the openings. For example, the first carrier layer and the second carrier layer are arranged in the openings. In this case, the holding elements are formed by material of the first carrier layer and the second carrier layer.

Subsequently, for example, a third carrier layer is arranged over the second carrier layer. The third carrier layer is in direct contact with the second carrier layer, for example. The third carrier layer is in particular an auxiliary carrier.

Here, the second carrier layer provides a mechanically stable connection between the first carrier layer and the third carrier layer.

According to at least one embodiment of the method, the sacrificial layer is removed in such a way that the carrier arrangement is mechanically connected to the semiconductor bodies only in the region of the holding elements. For example, the sacrificial layer is completely removed. For example, the sacrificial layer is removed by a chemical etching process.

In at least one further embodiment, the method for producing radiation-emitting semiconductor chips comprises the steps of:
  providing a semiconductor wafer,
  applying first contact layers onto the semiconductor wafer,
  producing a sacrificial layer on the semiconductor wafer, the sacrificial layer being penetrated by openings,
  attaching a carrier arrangement to the sacrificial layer, wherein holding elements of the carrier arrangement are each created in an opening of the sacrificial layer,
  singulating the semiconductor wafer into semiconductor bodies,
  applying second contact layers onto the semiconductor bodies, and
  removing the sacrificial layer in such a way that the carrier arrangement is mechanically connected to the semiconductor bodies only in the region of the holding elements.

It is possible that the steps listed are carried out in the order indicated.

One idea of the method for producing radiation-emitting semiconductor chips described here is, inter alia, to use a carrier arrangement in which the semiconductor bodies are mechanically connected to the carrier arrangement only in the region of the holding elements. The holding elements are connected with the semiconductor chips in such a way that the semiconductor chips can be separated from the holding elements without being destroyed. Advantageously, the produced semiconductor chips can thus be printed particularly efficiently onto a connection component by means of the carrier arrangement.

According to at least one embodiment of the method, a first dielectric layer is applied onto the semiconductor wafer. The first dielectric layer may completely cover the semiconductor wafer. Further, the first dielectric layer may be in direct contact with the semiconductor wafer. In particular, the dielectric layer is in direct contact with the first semiconductor layer sequence.

For example, the first dielectric layer comprises at least two first dielectric partial layers. The partial layer facing the semiconductor wafer comprises, for example, silicon dioxide or is formed thereof. The partial layer facing away from the semiconductor wafer comprises, for example, aluminum oxide or is formed thereof.

According to at least one embodiment of the method, first recesses are formed in the first dielectric layer. The first recesses may completely penetrate the first dielectric layer. For example, the first recesses expose regions of the semiconductor wafer. In particular, the first recesses expose the first semiconductor layer sequence in regions. A material removal of the first dielectric layer is performed in particular by an etching process.

According to at least one embodiment of the method, first contact layers are arranged in each of the first recesses. In the region of the first recesses, the first contact layers are in direct contact with the semiconductor wafer. The first contact layers do not project beyond the first dielectric layer in the vertical direction, for example. It is possible that top surfaces of the first contact layers are flush with a top surface of the first dielectric layer. Furthermore, the first contact layers may completely fill the first recesses.

According to at least one embodiment of the method, a second dielectric layer is applied over the first dielectric layer and the first contact layers. The second dielectric layer is, for example, in direct contact with the first dielectric layer and the first contact layers. For example, the second dielectric layer comprises or consists of a dielectric material, such as silicon dioxide or silicon nitride. It is further possible that the second dielectric layer is a Bragg mirror. The Bragg mirror preferably comprises alternately arranged layers of a high refractive index material and a low refractive index material. The layers of the Bragg mirror preferably comprise $SiO_2$, $Al_2O_3$, $TiO_2$, tantalum oxide, $Nb_2O_5$, MgF, silicon nitrides and/or silicon oxynitrides.

Furthermore, the second dielectric layer comprises a thickness which is, for example, at least 500 nm and at most 30 μm, in particular in about 1 μm.

In this embodiment, the second dielectric layer is formed such that the second dielectric layer mechanically stabilizes itself.

According to at least one embodiment of the method, a passivation layer is applied over the semiconductor bodies after singulating the semiconductor wafer. For example, the passivation layer completely covers an outer surface of the semiconductor bodies facing away from the carrier arrangement. Further, the passivation layer may completely cover a bottom surface of the first dielectric layer facing away from the carrier arrangement.

For example, the passivation layer comprises silicon dioxide or is formed thereof. With such a passivation layer, the semiconductor body is advantageously particularly well protected from external environmental influences.

It is further possible that the passivation layer is a Bragg mirror. Advantageously, electromagnetic radiation emitted by the semiconductor body can thus be directed in a specified direction. Thus, an efficiency of the radiation-emitting semiconductor chip is advantageously increased.

According to at least one embodiment of the method, second recesses spaced apart from the semiconductor bodies in lateral directions are created in the passivation layer. The second recesses penetrate the passivation layer completely, for example. If the second recesses penetrate exclusively the passivation layer, the second recesses each overlap with one of the first recesses in lateral directions.

Furthermore, it is possible for the second recesses to completely penetrate the passivation layer and the first dielectric layer. If the second recesses penetrate the first dielectric layer and the passivation layer, the second recesses are spaced apart from the first recesses in lateral directions.

According to at least one embodiment of the method, third recesses are created in the passivation layer, each of which overlaps with one of the semiconductor bodies in lateral directions. The third recesses penetrate the passivation layer completely, for example. Furthermore, the third recesses each overlap in lateral directions with one of the first recesses.

According to at least one embodiment of the method, the third recesses each expose one of the semiconductor bodies in regions. For example, the second semiconductor layer of each semiconductor body is exposed in regions.

According to at least one embodiment of the method, second contact layers are applied onto one of the exposed semiconductor bodies, respectively. In the region of the third recesses, the second contact layers are in direct contact with the semiconductor body. The second contact layers may project beyond the passivation layer in the vertical direction. Furthermore, it is possible that the second contact layers project beyond the third recesses in lateral directions and are arranged on the passivation layer in regions. That is, the second contact layers are arranged, for example, in regions on a bottom surface of the passivation layer facing away from the semiconductor body.

According to at least one embodiment of the method, further first contact layers are applied onto side surfaces of the passivation layer. Furthermore, the further first contact layers may be arranged on the bottom surface of the passivation layer. The further first contact layers comprise, for example, the same materials as the first contact layers. Alternatively, it is possible that the further first contact layers are formed with a material that is different from a material of the first contact layers. That is, the further first contact layers may comprise a transparent conductive metal, transparent conductive oxides, or a reflective electrically conductive metal.

If the semiconductor bodies are electrically conductively connected by the first contact layers, the further first contact layers and the second contact layers, the further first contact layers and the second contact layers are advantageously arranged on the bottom surface of the passivation layer, spaced apart in lateral directions. In this case, the further first contact layers and the second contact layers can be electrically conductively connected from a side facing away from the carrier arrangement. The further first contact layers and the second contact layers can furthermore advantageously be printed directly onto the connection component.

If the further first contact layers comprise a TCO material, the further first contact layers are formed as a ridge on the side surfaces of the passivation layer. In this case, the ridge has a width of at most 5 µm. For example, the width of the ridge is at most 50% of an extension in lateral directions of the radiation-emitting semiconductor chip. In this case, electromagnetic radiation is advantageously absorbed particularly little at the side surfaces of the passivation layer.

If the further first contact layers have a reflective, electrically conductive metal, the further first contact layers cover the side surfaces of the passivation layer to a large extent. Here, to a large extent means that the further first contact layers cover at least 90%, in particular 95%, of the side surfaces of the passivation layer. Furthermore, the first contact layers may completely enclose the side surfaces of the passivation layer in lateral directions. In this case, the second contact layers also comprise a reflective, electrically conductive metal and the first contact layers comprise a TCO material. Thus, the light out-coupling and efficiency of the radiation-emitting semiconductor chip can advantageously be particularly high.

Furthermore, it is possible that a reflective mirror is arranged between the semiconductor bodies and the passivation layer. Thus, the light out-coupling and efficiency of the radiation-emitting semiconductor chip can be particularly good.

According to at least one embodiment of the method, the further first contact layers are each electrically conductively connected with one of the first contact layers in each of the second recesses. In this embodiment, the second recess and the first recesses overlap in lateral directions. The further first contact layers and the first contact layers are in direct contact at an interface of the second recesses and the first recesses, for example.

According to at least one embodiment of the method, fourth recesses each overlapping with one of the first recesses in lateral directions are created in the second dielectric layer. The fourth recesses penetrate the second dielectric layer completely, for example. The fourth recesses may expose the first contact layers in regions.

According to at least one embodiment of the method, first contacts are each arranged in one of the fourth recesses. A side surface of the fourth recess is formed, for example, by the limiting second dielectric layer, and a bottom surface of the fourth recess is formed, for example, by one of the limiting first contact layers. The first contacts completely cover the side surfaces and bottom surfaces of the fourth recesses.

For example, the first contacts comprise an electrically conductive metal. In this case, for example, the first contacts comprise one or more of the following materials or consist of one or more of these materials: Au, Ag, Al, Cu, Ni, Rh, Pd, Pt.

Alternatively, the first contact layers comprise a transparent conductive metal or a transparent conductive oxide.

According to at least one embodiment of the method, the first contacts are each in electrically conductive contact with one of the first contact layers in one of the fourth recesses. For example, the first contacts are in direct contact with the first contact layers exposed in regions by the fourth recesses.

According to at least one embodiment of the method, fifth recesses spaced apart in lateral directions from the first recesses are created in the second dielectric layer. The fifth recesses penetrate the second dielectric layer completely, for example. The fifth recesses may expose regions of the first dielectric layers. If the second recesses penetrate the passivation layer and the first dielectric layer, the fifth recesses each overlap with one of the second recesses in lateral directions.

According to at least one embodiment of the method, second contacts are each arranged in one of the fifth recesses. A side surface of the fifth recess is formed, for example, by the limiting second dielectric layer and a bottom surface of the fifth recess is formed, for example, by the limiting first dielectric layer. The second contacts completely cover the side surfaces and bottom surfaces of the fifth recesses.

For example, the second contacts are formed by the same material as the first contacts.

According to at least one embodiment of the method, further second contact layers are applied onto side surfaces of the passivation layer. The further second contact layers comprise, for example, the same materials as the second contact layers. Alternatively, it is possible that the further second contact layers are formed with a material that is different from a material of the second contact layers. The further second contact layers may comprise a transparent conductive metal, transparent conductive oxides, or a reflective electrically conductive metal.

If the further second contact layers comprise a TCO, the further second contact layers are formed as a ridge on the side surfaces of the passivation layer. In this case, the ridge comprises a width of at most 5 µm. For example, the width of the ridge is at most 50% of an extension in lateral directions of the radiation-emitting semiconductor chip. In this case, electromagnetic radiation is advantageously absorbed particularly little at the side surfaces of the passivation layer.

If the further second contact layers comprise a reflective, electrically conductive metal, the further second contact layers cover the side surfaces of the passivation layer to a large extent. Here, to a large extent means that the additional second contact layers cover at least 90%, in particular 95%, of the side surfaces of the passivation layer. Furthermore, the second contact layers may completely enclose the side surfaces of the passivation layer in lateral directions. In this case, the first contact layers also comprise a reflective, electrically conductive metal and the second contact layers comprise a TCO material.

According to at least one embodiment of the method, the second contact layers and the further second contact layers each electrically conductively connect one of the second contacts with a respective one of the exposed semiconductor bodies. The further second contact layers and the second contacts are in direct contact at an interface of the second recesses and the fifth recesses, for example.

A producing of a connection of the second contact layers with the second contacts is advantageously producible in a single manufacturing process. Furthermore, by using further first and/or further second contact layers, vias through the semiconductor body can be avoided. This advantageously reduces non-radiative recombinations (NRR), which occur for example on the side walls of vias.

In particular, such produced radiation-emitting semiconductor chips are micro-LEDs, which can be produced particularly efficiently with the method described here and are particularly easy to transfer. The micro-LEDs comprise, for example, an extension in lateral directions of at most 100 µm, in particular at most 50 µm.

Furthermore, a radiation-emitting semiconductor chip is described which can be produced in particular with a method described herein. All features and embodiments disclosed in connection with the method are therefore also disclosed in connection with the radiation-emitting semiconductor chip, and vice versa.

According to at least one embodiment, the radiation-emitting semiconductor chip comprises a semiconductor body configured to emit electromagnetic radiation. The semiconductor body preferably comprises a first semiconductor layer sequence and a second semiconductor layer sequence, between which an active region is arranged that is configured for generation of electromagnetic radiation in operation. The electromagnetic radiation is, for example, near-ultraviolet radiation, visible light, and/or near-infrared radiation. The visible light is, for example, light of blue, green, yellow or red color.

According to at least one embodiment, the radiation-emitting semiconductor chip comprises a first contact layer. For example, the first contact layer is in direct contact with the first semiconductor layer sequence.

According to at least one embodiment of the method, the radiation-emitting semiconductor chip comprises a second contact layer. The second contact layer is, for example, in direct contact with the second semiconductor layer sequence.

According to at least one embodiment of the method, a current can be impressed into the semiconductor body through the first contact layer and the second contact layer. For example, charge carriers can be impressed into the first semiconductor layer sequence via the first contact layer. Furthermore, charge carriers can be impressed into the second semiconductor layer sequence via the second contact layer.

According to at least one embodiment, the radiation-emitting semiconductor chip exclusively comprises components that are configured to be transparent to the electromagnetic radiation emitted by the semiconductor body. For example, the light-transmissive components transmit at least 80%, in particular at least 90%, of the electromagnetic radiation emitted by the semiconductor body.

If the radiation-emitting semiconductor chip comprises, for example, metallic layers, these each comprise a thickness of at most 5 nm, in particular at most 0.5 nm. Furthermore, the metallic layers cover at most 0.5% of an outer surface of the semiconductor body. In particular, the metallic layers covered not more than 1 µm$^2$ of the outer surface of the semiconductor body.

Such a radiation-emitting semiconductor chip can thus be integrated particularly well into a wide variety of housings. In this case, a light alignment can be specified by the housing. In other words, such radiation-emitting semiconductor chips can be used in a particularly flexible manner. Furthermore, such a radiation-emitting semiconductor chip comprises a particularly simple chip structure.

According to at least one embodiment, the first contact layer and the second contact layer comprise a transparent conductive material. For example, the transparent conductive material is a TCO material, such as ITO.

For example, TCOs comprise highly doped oxide semiconductors, which is transparent to electromagnetic radiation emitted from the semiconductor body and is formed electrically conductive. Thus, the first contact layer and the second contact layer do not comprise a metallic layer. Thus, the radiation-emitting semiconductor chip can be free of metallic layers and elements as a whole.

Metallic layers absorb a comparatively high proportion of the electromagnetic radiation emitted by the semiconductor body. In comparison, TCOs comprise a comparatively low absorption of the electromagnetic radiation emitted by the semiconductor body.

According to at least one embodiment, the first contact layer is arranged on a bottom surface of the semiconductor body. For example, the bottom surface of the semiconductor body is formed by a bottom surface of the second semiconductor layer sequence. Furthermore, the second contact layer may also be arranged on the bottom surface of the semiconductor body, in particular on the bottom surface of the second semiconductor layer sequence.

According to at least one embodiment, the first contact layer extends from the bottom surface of the semiconductor body into the semiconductor body. For example, the semiconductor body comprises a penetration extending from the second semiconductor layer sequence into the first semiconductor layer sequence. The first contact layer is in direct contact with the first semiconductor layer sequence in the region of the penetration.

Furthermore, a radiation emitting device comprising a radiation emitting semiconductor chip described herein is specified. All features and embodiments disclosed in connection with the radiation-emitting semiconductor chip are therefore also disclosed in connection with the radiation-emitting device and vice versa.

According to at least one embodiment, the radiation emitting device comprises a carrier comprising at least a first contact element. For example, the first contact element comprises an electrically conductive metal. In this case, for example, the first contact element comprises or consists of one or more of the following materials: Au, Ag, Al, Cu, Ni, Rh, Pd, Pt.

Alternatively, the first contact element comprises a transparent conductive metal or a transparent conductive oxide.

According to at least one embodiment, the radiation emitting semiconductor chip is arranged on the carrier by means of a direct bond connection and/or an adhesive. For example, a direct bond connection is free of a solder metal.

In the direct bond connection, the semiconductor chip is mechanically stably connected with the carrier, for example, by atomic and/or molecular forces. The atomic and/or molecular forces are, for example, hydrogen bonding and/or Van der Wals interactions. The direct bond connection usually occurs between two planar interfaces under the action of pressure and/or temperature alone. Thus, a solder metal is not required for a direct bond connection. Advantageously, absorption losses can thus be avoided.

For example, the adhesive comprises a matrix material. The matrix material may, for example, be a resin, such as an epoxy, or a silicone, or a mixture of these materials. Further, electrically conductive particles may be introduced into the matrix material. The electrically conductive particles impart electrically conductive properties to the adhesive, for example. Alternatively, the adhesive is an electrically insulating adhesive. Alternatively, the adhesive is a spin-on glass.

If the radiation emitting semiconductor chip is arranged on the carrier by means of a direct bond, interstitial spaces may occur between the semiconductor chip and the carrier. In this case, the adhesive is arranged at least partially or completely in the interstitial spaces. Advantageously, the radiation-emitting device is thus formed particularly stable.

Furthermore, it is possible that the adhesive can be used only for positioning the radiation-emitting semiconductor chip on the carrier. After the positioning and an attachment of the semiconductor chip to the carrier, the adhesive is incineratable in this case.

According to at least one embodiment, the carrier and/or the first contact element are transparent to the electromagnetic radiation emitted by the semiconductor body.

According to at least one embodiment, the first contact element is reflective for electromagnetic radiation emitted by the semiconductor body.

According to at least one embodiment, the first contact element comprises a curved shape. For example, the first contact element comprises a concave shape. Thus, the first contact element may comprise a cavity in which the radiation emitting semiconductor chip is arranged. For example, the radiation-emitting semiconductor chip is arranged completely within the cavity. Further, the radiation-emitting semiconductor chip may be completely enclosed by the first contact element in lateral directions.

BRIEF DESCRIPTION OF THE DRAWINGS

In the following, the method for producing a radiation-emitting semiconductor chip, the radiation-emitting semiconductor chip, and the radiation-emitting device will be explained in more detail with reference to exemplary embodiments and the accompanying figures.

FIGS. 1, 2, 3, 4, 5, 6, 7, 8, 9, 10, 11, 12, 13, 14, 15, and 16 show schematic sectional views of method stages in producing a radiation-emitting semiconductor chip according to an exemplary embodiment;

Figure 4:
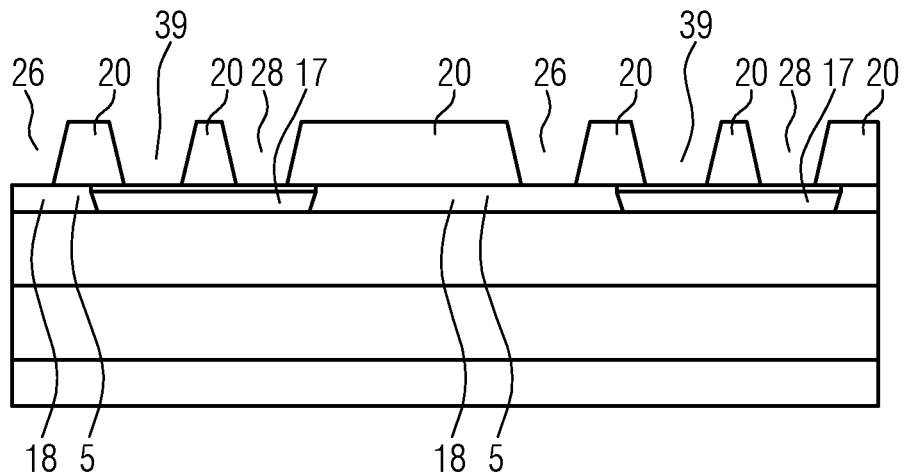

Elements that are identical, of the same kind or have the same effect are provided with the same reference signs in the figures. The figures and the proportions of the elements shown in the figures are not to be regarded as to scale. Rather, individual elements may be shown exaggeratedly large for better illustration and/or for better comprehensibility.

DETAILED DESCRIPTION OF ILLUSTRATIVE EMBODIMENTS

According to FIG. 1, in a method step for producing a radiation-emitting semiconductor chip 1, a semiconductor wafer 2 is first provided. The semiconductor wafer 2 comprises a first semiconductor layer sequence 3 and a second semiconductor layer sequence 3. Here, the semiconductor wafer 2 is epitaxially grown on a growth substrate 16. The first semiconductor layer sequence 3 is p-doped in this exemplary embodiment, and the second semiconductor layer sequence 4 is n-doped in this exemplary embodiment.

A first dielectric layer 17 is applied onto the semiconductor wafer 2, in particular onto the first semiconductor layer sequence 3. The first dielectric layer 17 is in direct contact with the semiconductor wafer 2. Here, the first dielectric layer 17 comprises two first dielectric layers 17. In this case, the first dielectric layer 17 facing the semiconductor wafer 2 comprises silicon dioxide and has a thickness of at most 50 nm. The first dielectric layer 17 facing away from the semiconductor wafer 2 comprises aluminum oxide and also comprises a thickness of at most 50 nm.

According to FIG. 2, first recesses 18 are created in the first dielectric layer 17 in a further method step. The first recesses 18 completely penetrate the first dielectric layer 17 and expose the semiconductor wafer 2, in particular the first semiconductor layer sequence 3, in regions.

Subsequently, first contact layers 5 are applied onto the semiconductor wafer 2, in particular onto the first semiconductor layer sequence 3. In this exemplary embodiment, the first contact layers 5 are each arranged in one of the first recesses 18. The first contact layers 5 are in direct contact with the semiconductor wafer 2 in the region of the first recesses 18. In this exemplary embodiment, the first contact layers 5 comprise a TCO, such as ITO. A thickness of the first contact layers 5 in this case is at most 50 nm. Thus, the thickness of the first contact layers 5 is smaller than the thickness of the first dielectric layers 17.

In this exemplary embodiment, the first contact layers 5 cover a large extent of a top surface of the first semiconductor layer sequence 3. Here, to a large extent means that the first contact layers 5 each cover at least 70% of the top surface of the first semiconductor layer sequence 3.

In the method step as shown in FIG. 3, a second dielectric layer 20 is applied over the first dielectric layer 17 and the first contact layers 5. Here, the second dielectric layer 20 is in direct contact with the first dielectric layer 17 and the first contact layers 5. In this exemplary embodiment, the second dielectric layer 20 comprises silicon dioxide and has a thickness of about 1 μm.

In a further method step according to FIG. 4, fourth recesses 26 each overlapping in lateral directions with one of the first recesses 18 are created in the second dielectric layer 20. Further, fifth recesses 28 spaced apart in lateral directions from the first recesses 18 are created in the second dielectric layer 20. The fourth recesses 26 and the fifth recesses 28 completely penetrate the second dielectric layer 20. Here, the fourth recesses 26 expose the first contact layers 5 in regions and the fifth recesses 28 expose the first dielectric layers 5 in regions.

Further, first singulation trenches 39 are created in the second dielectric layer 20 that are spaced apart in lateral directions from the first recesses 18. The first singulation trenches 39 are each arranged here between one of the fourth recesses 26 and one of the fifth recesses 28. The first singulation trenches 39 completely penetrate the second dielectric layer 20. Further, the first singulation trenches 39 expose the first dielectric layers in regions.

Figure 5:
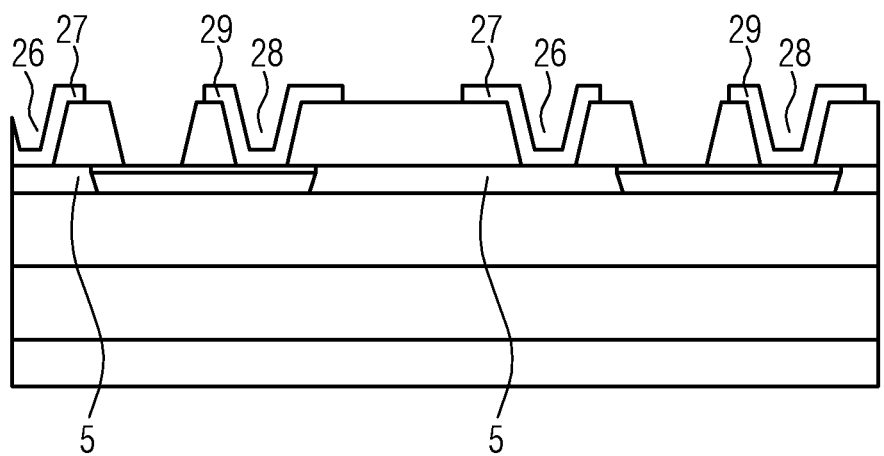

As shown in FIG. 5, first contacts 27 are each arranged in one of the fourth recesses 26. The first contacts 27 completely cover the surfaces limiting the fourth recesses 26. Furthermore, second contacts 29 are arranged in one of the fifth recesses 28, respectively. The second contacts 29 completely cover the surfaces limiting the fifth recesses 28. The first contacts 27 and the second contacts 29 both comprise an electrically conductive metal. Furthermore, the first contacts 27 are each in electrically conductive contact with one of the first contact layers 5 in one of the fourth recesses 26.

Figure 6:
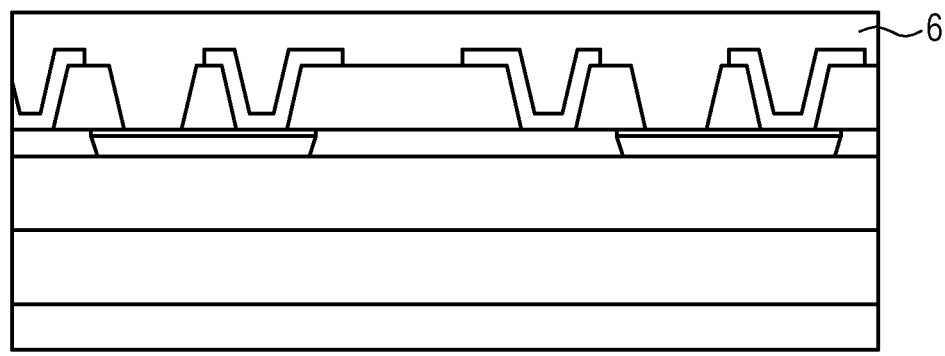

In the method step according to FIG. 6, a sacrificial layer 6 is applied onto the semiconductor wafer 2, in particular onto the first semiconductor layer sequence 3. In this exemplary embodiment, the sacrificial layer 6 comprises silicon.

Figure 7:
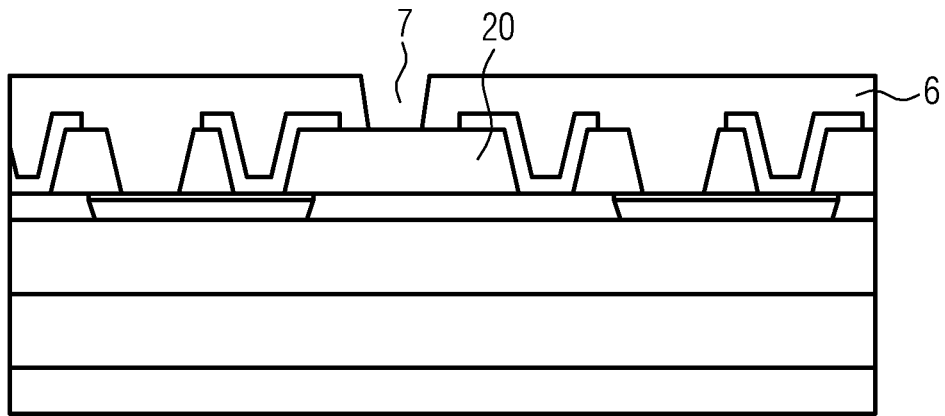

According to FIG. 7, openings 7 are created in the sacrificial layer 6, which completely penetrate the sacrificial layer 6 and expose the second dielectric layer 20 in regions.

Figure 8:
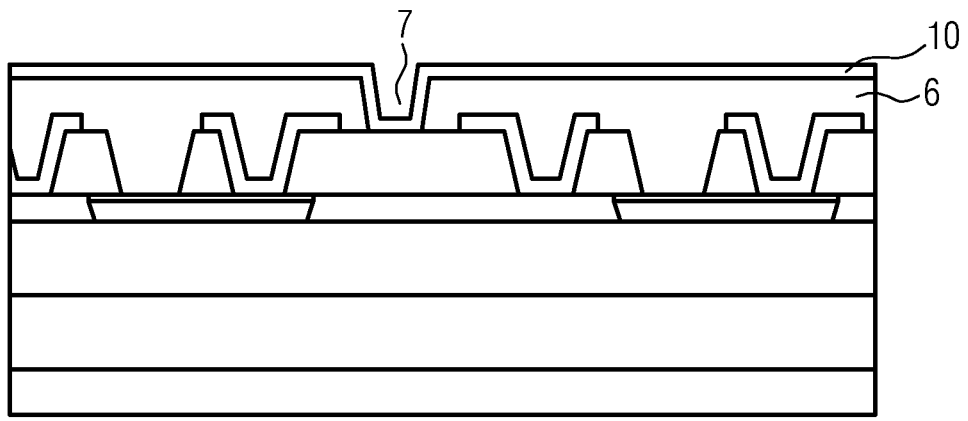
Figure 9:
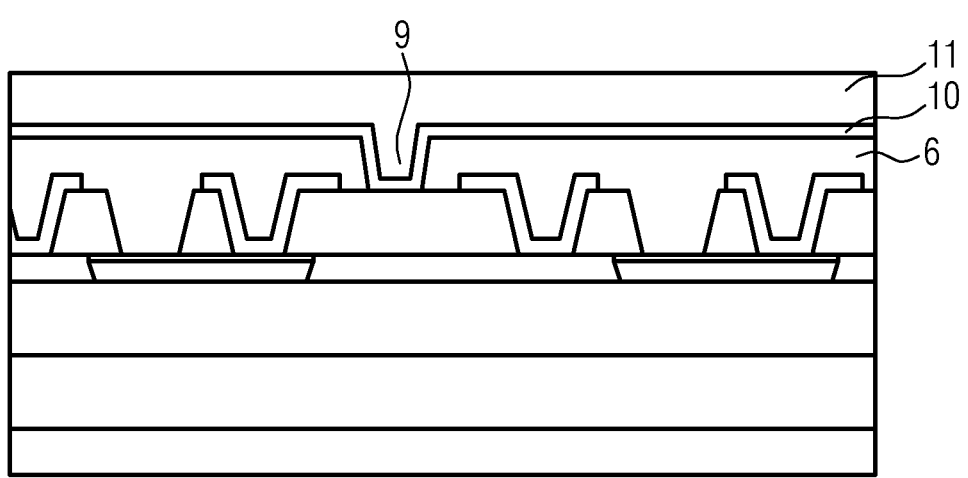
Figure 10:
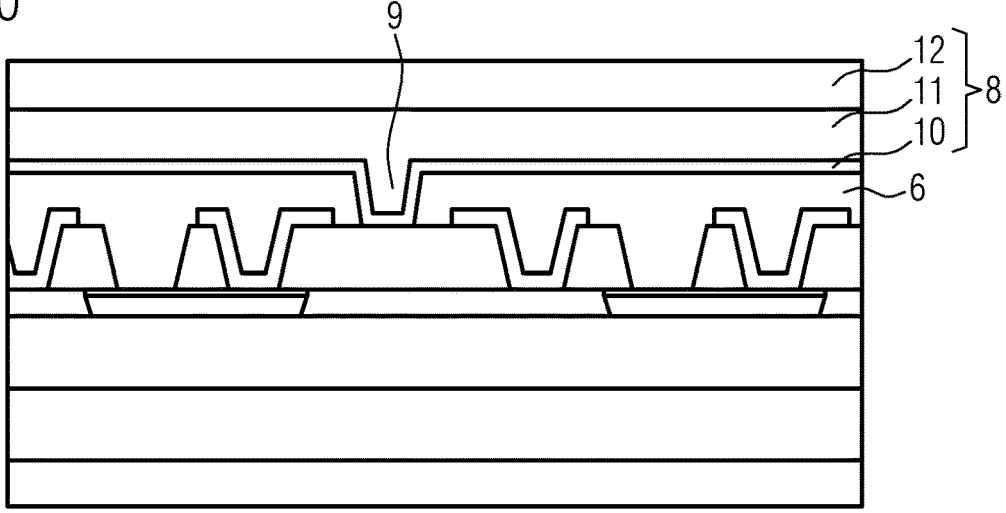

On top of the sacrificial layer 6, a carrier arrangement 8 is attached to the sacrificial layer 6 in conjunction with FIGS. 8, 9 and 10.

As shown in FIG. 8, a first carrier layer 10 is applied over the sacrificial layer 6. The first carrier layer 10 completely covers the sacrificial layer 6 and is also arranged in the openings 7. In this exemplary embodiment, the first carrier layer comprises aluminum oxide and comprises a thickness of at least 50 nm and at most 500 nm.

Subsequently, as shown in FIG. 9, a second carrier layer 11 is applied over the first carrier layer 10. The second carrier layer 11 fills the openings 7 and projects vertically above the openings 7. In this exemplary embodiment, the second carrier layer comprises an adhesion promoting material, such as benzocyclobutene.

In a subsequent method step, a third carrier layer 12 is arranged over the second carrier layer 11, as shown in FIG. 10. In this exemplary embodiment, the third carrier layer 12 is an auxiliary carrier.

Furthermore, holding elements 9 arranged in the openings 7 are defined by the carrier arrangement 8. In this exemplary embodiment, the first carrier layer 10 and the second carrier layer 11 are arranged in the openings and form the holding elements 9.

Figure 11:
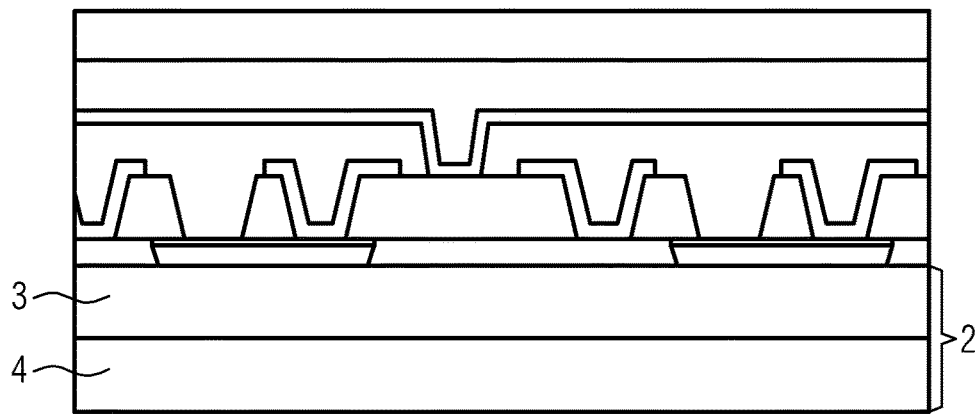

In the method step according to FIG. 11, the growth substrate 16 is detached from the semiconductor layer sequence 2.

Figure 12:
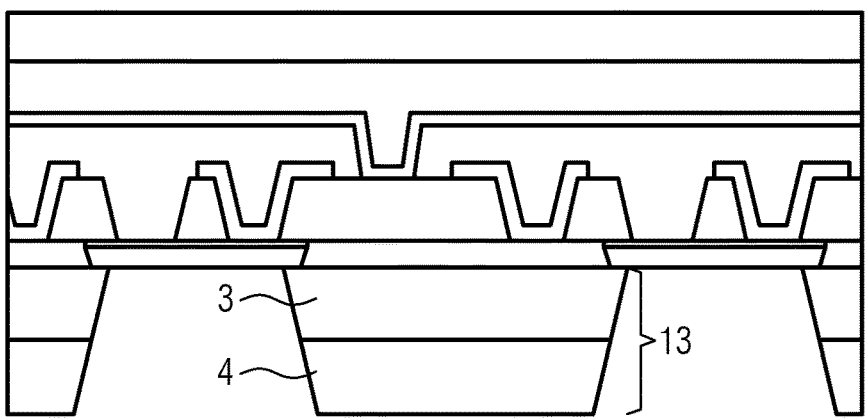

FIG. 12 shows a further method step in which the semiconductor wafer 2 is singulated to form semiconductor bodies 13. For example, the semiconductor wafer 2 is singulated into semiconductor bodies 13 by cuts in vertical direction through the semiconductor wafer 2. The cuts completely penetrate the semiconductor wafer 2 in this exemplary embodiment.

Figure 13:
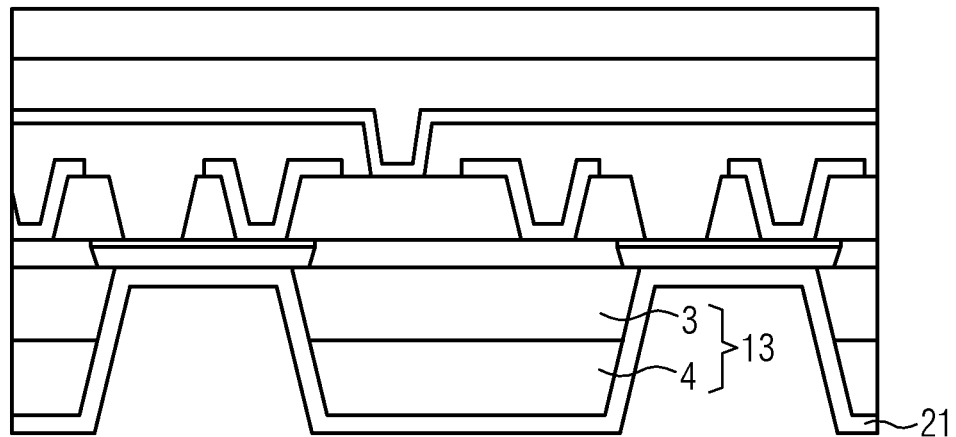

According to FIG. 13, a passivation layer 21 is applied over the semiconductor bodies 13 in this method step. The passivation layer 21 completely covers an outer surface of the semiconductor bodies 13 facing away from the carrier arrangement 8. Furthermore, the passivation layer 8 completely covers a bottom surface of the first dielectric layer 17 facing away from the carrier arrangement 8. In this exemplary embodiment, the passivation layer comprises silicon dioxide.

Figure 14:
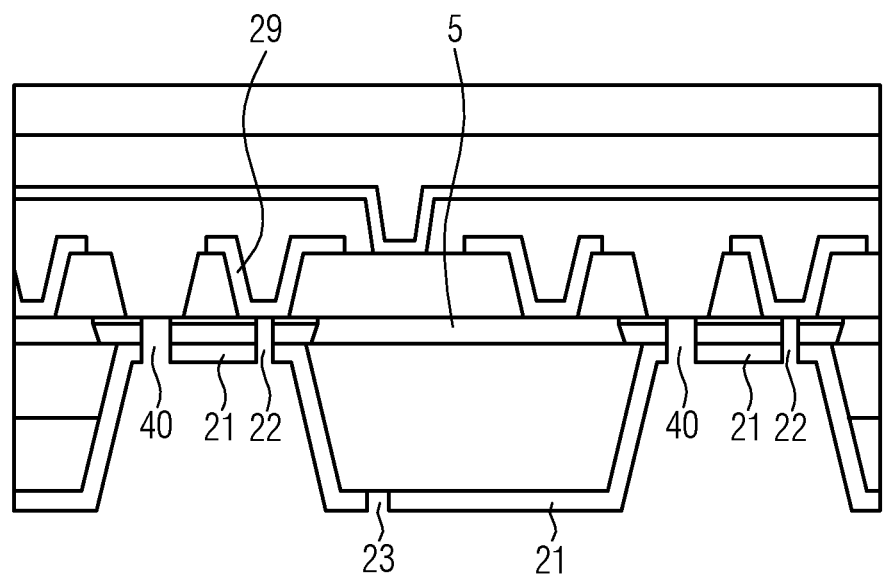

As shown in connection with FIG. 14, in a further method step, second recesses 22 spaced apart in lateral directions from the semiconductor bodies 13 are created in the passivation layer 21. In this exemplary embodiment, the second recesses 22 also completely penetrate the first dielectric layer 17. Here, the second recesses 22 expose a region of the second contact 29.

Furthermore, third recesses 23 each overlapping with one of the semiconductor bodies 13 in lateral directions are created in the passivation layer 21. The third recesses 23 penetrate the passivation layer 8 completely, for example. The third recesses 23 each expose one of the semiconductor bodies 13, in particular the second semiconductor layer sequence 4, in regions.

Furthermore, second singulation trenches 40 each overlapping in lateral directions with one of the first singulation trenches 39 are created in the first dielectric layer 17. The second singulation trenches 40 completely penetrate the first dielectric layer 17. Furthermore, the second singulation trenches 40 expose the sacrificial layer 6 in regions.

Figure 15:
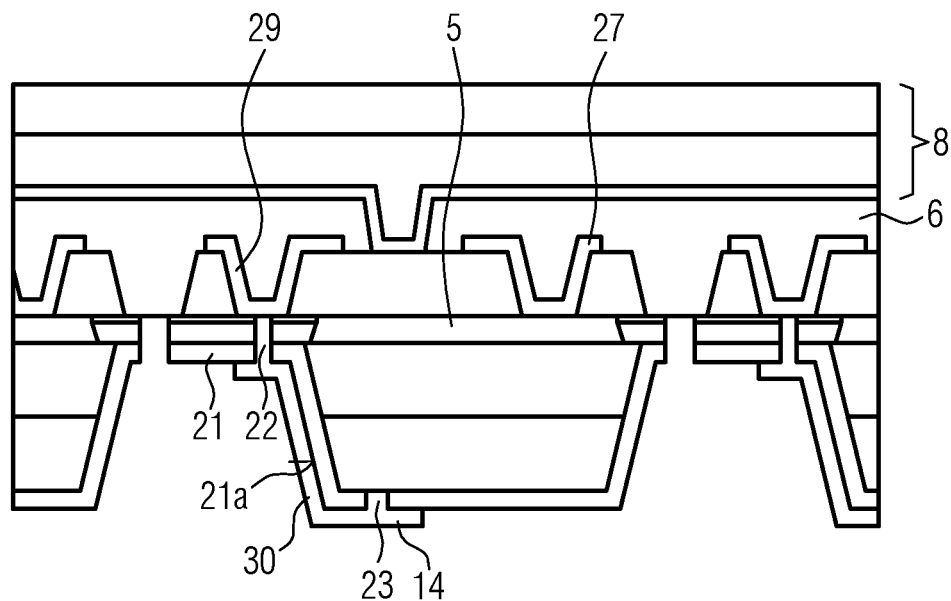

FIG. 15 shows another method step in which second contact layers 14 are applied onto the semiconductor bodies 13 exposed by the third recesses 23. Here, the second contact layers 14 are in direct contact with the semiconductor bodies 13, in particular the second semiconductor layer sequence 4. The second contact layers 14 completely fill the third recesses 23 and project beyond the passivation layer 21 in the vertical direction. Furthermore, the second contact layers 14 project beyond the third recesses 23 in lateral directions and are arranged on the passivation layer 21 in regions.

Furthermore, further second contact layers 30 are applied onto side surfaces of the passivation layer 21. The further second contact layers 30 completely fill the second recesses 22. The second contact layers 14 and the further second contact layers 30 each electrically conductively connect one of the second contacts 29 with a respective one of the exposed semiconductor bodies 13, in particular the second semiconductor layer sequence 4.

In this exemplary embodiment, the second contact layers 14 and the further second contact layers 30 comprise a TCO, such as ITO. In this case, the further second contact layers 30 on the side surface of the passivation layer 21a comprise a thickness of at least 50 nm and at most 20 nm. Furthermore, the further first contact layers 30 in this exemplary embodiment are formed on the side surfaces of the passivation layer 21a as a ridge, which comprises a width of at most 5 µm.

Figure 16:
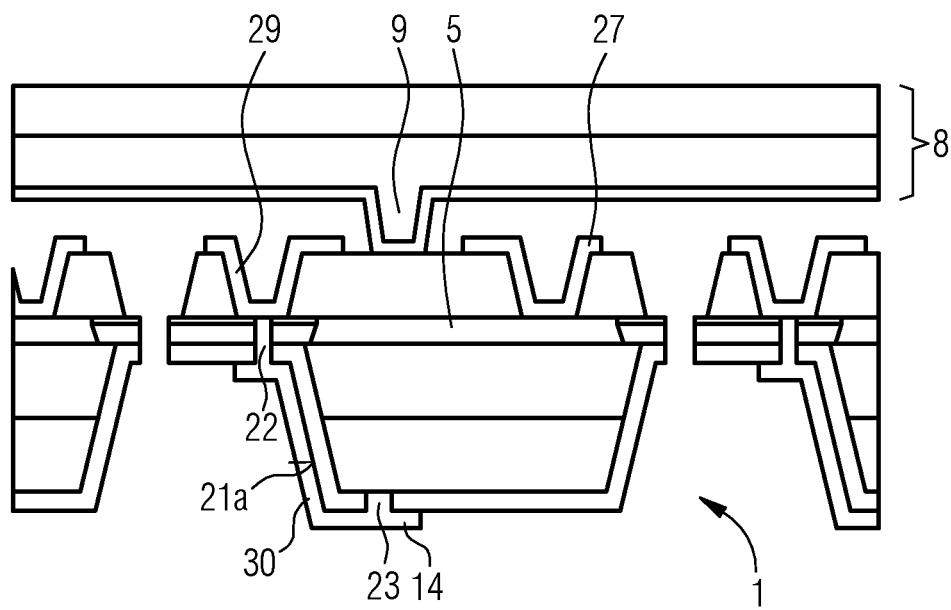

In a further step according to FIG. 16, the sacrificial layer 6 is removed in such a way that the carrier arrangement 8 is mechanically connected to the semiconductor bodies 13 only in the region of the holding elements 9. In this exemplary embodiment, the sacrificial layer 6 is removed by a chemical etching process.

The radiation-emitting semiconductor chips 1 are thus mechanically connected to the carrier arrangement 8 only through the holding element 9. Advantageously, the created semiconductor chips 1 can thus be printed on a terminal component by means of the carrier arrangement 8.

Figure 17:
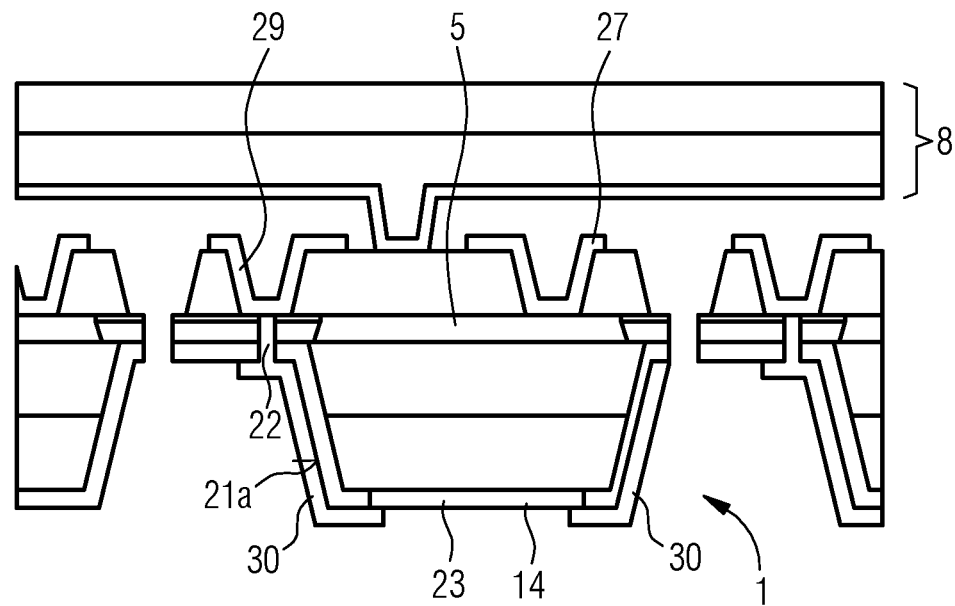
FIGS. 17, 18, 19, 20, 21, 22, and 23 show schematic sectional views of a radiation emitting semiconductor chip with a carrier arrangement according to an exemplary embodiment, respectively.

The radiation-emitting semiconductor chip 1 according to the exemplary embodiment of FIG. 17, in contrast to the exemplary embodiment of FIG. 16, comprises first contact layers 5 which comprise a reflective, electrically conductive metal. Furthermore, the further second contact layers 30 are a reflective, electrically conductive metal. In this exemplary embodiment, the further first contact layers 30 cover the side surfaces of the passivation layer 21a to a large extent.

In this exemplary embodiment, the first contact layers 5 and the further second contact layers 30 are reflective to electromagnetic radiation generated in the semiconductor bodies 13.

In this exemplary embodiment, second contact layers 14 cover a large extent of a bottom surface of the second semiconductor layer sequence 4. Here, to a large extent means that the second contact layers 14 each cover at least 90% of the bottom surface of the second semiconductor layer sequence 4. Through such second contact layers 14, the radiation generated in the semiconductor bodies 13 can be coupled out.

Figure 18:
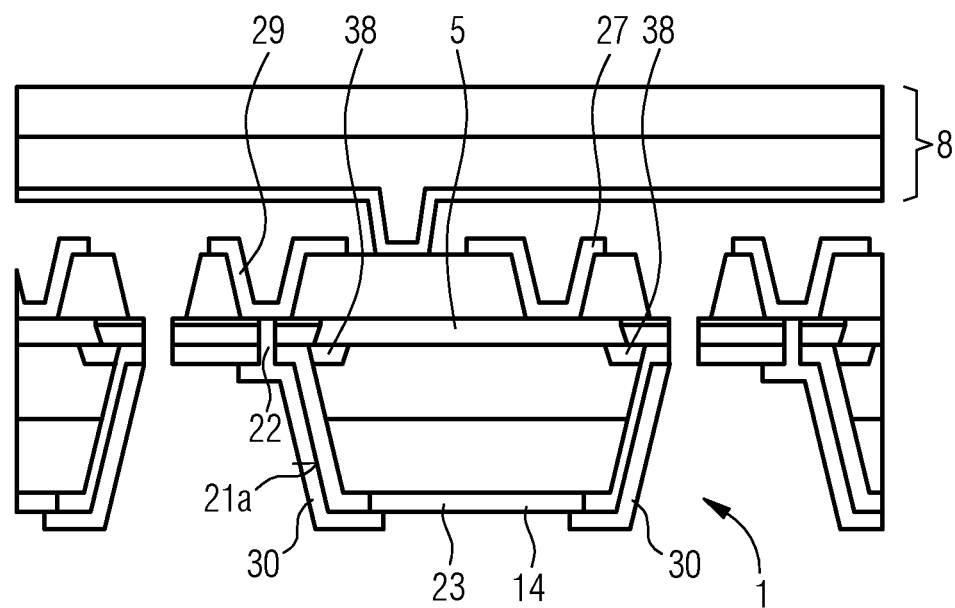

The radiation-emitting semiconductor chip 1 according to the exemplary embodiment of FIG. 18 comprises, in contrast to the exemplary embodiment of FIG. 17, further reflective mirrors 38 which partially cover side surfaces of the semiconductor bodies 13, in particular side surfaces of the first semiconductor layer sequence 3. The further reflective mirrors 38 are formed, for example, with the same materials as the first contact layers 5. Thus, in this exemplary embodiment, the further reflective mirrors 38 are formed to be reflective for electromagnetic radiation generated in the semiconductor bodies 13.

Advantageously, the reflectively formed first contact layers 5, the further second contact layers and the further reflective mirrors 38 each completely enclose a semiconductor body 13 except for the transparently formed second contact layers 14.

Figure 19:
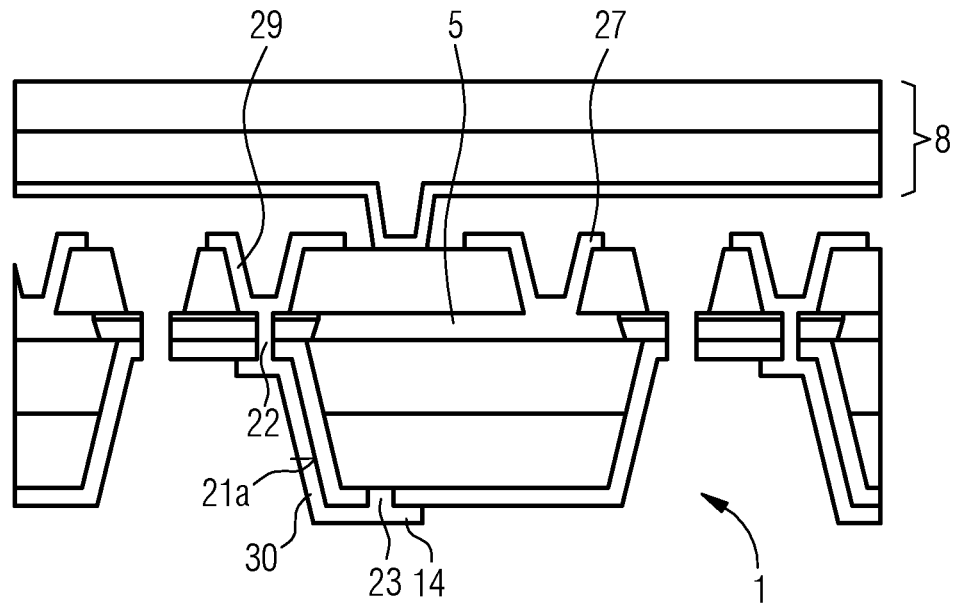

In the radiation-emitting semiconductor chip 1 according to the exemplary embodiment of FIG. 19, the first contacts 27 and the second contacts 29 are formed with a TCO, in contrast to the exemplary embodiment of FIG. 16.

Figure 20:
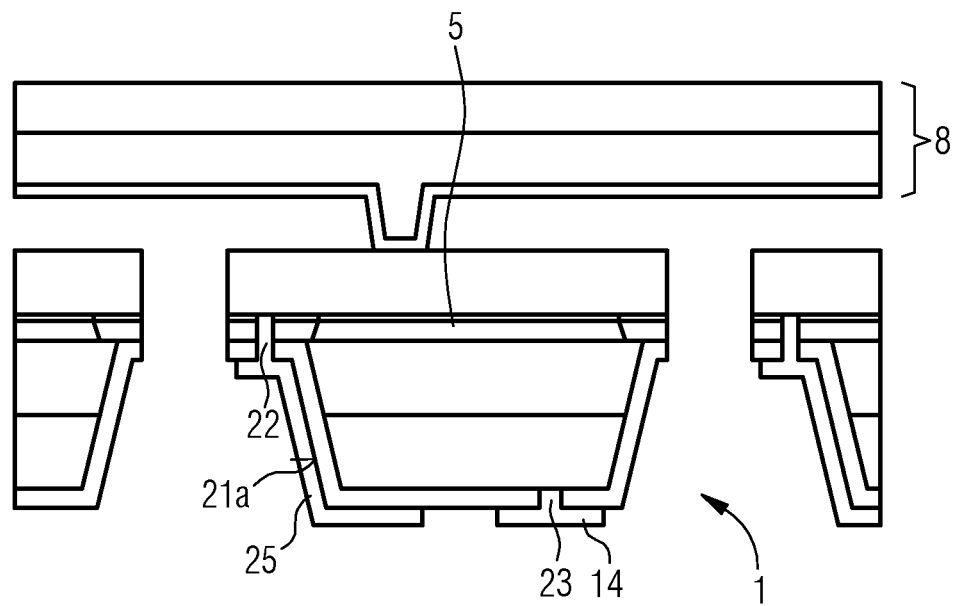

In contrast to the exemplary embodiments of FIGS. 16, 17, 18 and 19, the radiation-emitting semiconductor chip 1 according to the exemplary embodiment of FIG. 20 does not comprise first contacts 27 and second contacts 29. Accordingly, fourth recesses 26 and fifth recesses 28 are also not arranged in the second dielectric layer 20.

In this exemplary embodiment, the second semiconductor layer 4 in the region per semiconductor body 13 can be electrically conductively contacted only by the second contact layers 14. Thus, the semiconductor chip 1 here comprises no further second contact layers 30.

Furthermore, further first contact layers 25 are arranged on side surfaces of the passivation layer 21a. The further first contact layers are also arranged on the bottom surface of the passivation layer 21.

The further first contact layers 25 are each electrically conductively connected with one of the first contact layers 5 in a respective one of the second recesses 22.

The further first contact layers 25 here comprise the same materials as the first contact layers 5, such as a TCO in this exemplary embodiment. The further first contact layers 25 are formed as a ridge on the side surfaces of the passivation layer 21a. In this case, the ridge comprises a width of 5 μm or less.

Figure 21:
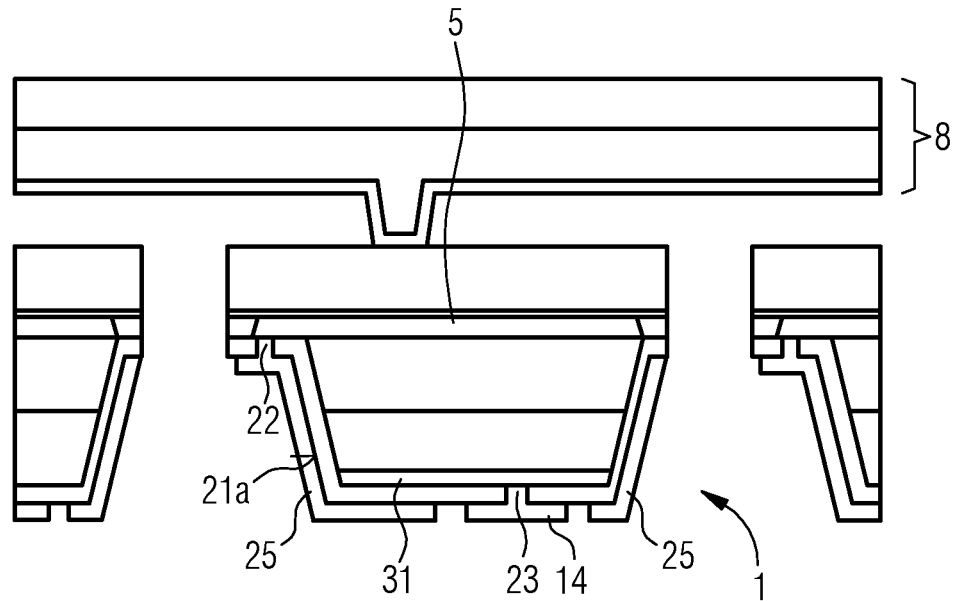

In the radiation-emitting semiconductor chip 1 according to the exemplary embodiment of FIG. 21, the further first contact layers 25 and the second contact layers 14 are formed with a reflective, electrically conductive metal, in contrast to the exemplary embodiment of FIG. 20.

Furthermore, a reflective mirror 31 is arranged between the semiconductor bodies 13, in particular the second semiconductor layer sequence 4, and the passivation layer 21.

Figure 22:
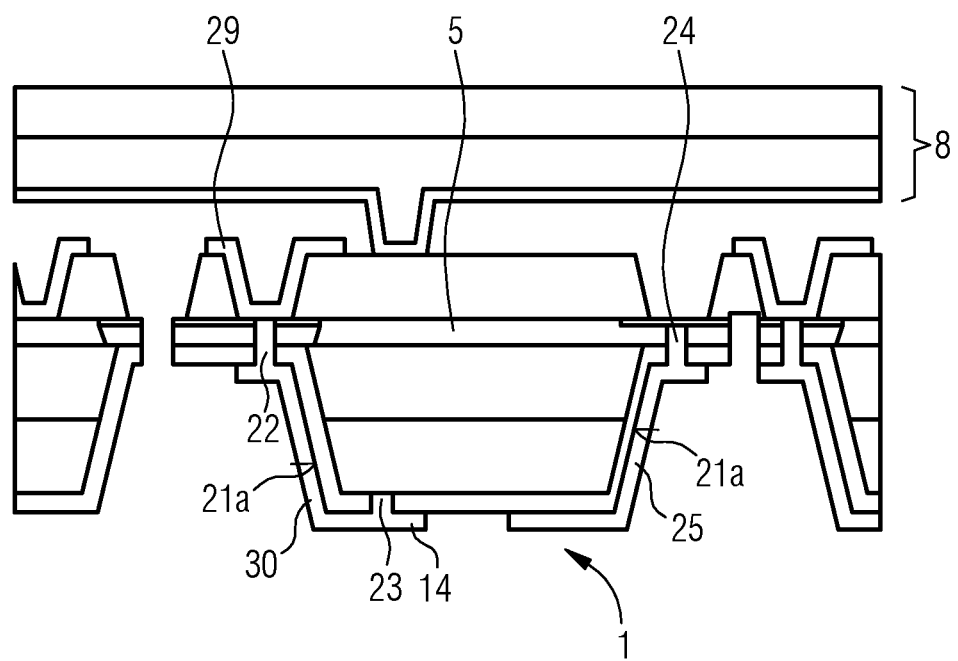

According to the exemplary embodiment of FIG. 22, the second semiconductor layer 4 of each semiconductor body 13 is electrically conductively connected with a second contact 29 as in the exemplary embodiment of FIG. 16. However, the semiconductor chip 1 does not comprise any first contacts 27. Further second recesses 24 spaced apart in lateral directions from the semiconductor bodies 13 and the second recesses 22 are created in the passivation layer 21. The further second recesses 24 completely penetrate the passivation layer 21. Further first contact layers 25, arranged on a lateral surface of the passivation layer 21, are each electrically conductively connected with one of the first contact layers 5 in a respective one of the further second recesses 24.

Figure 23:
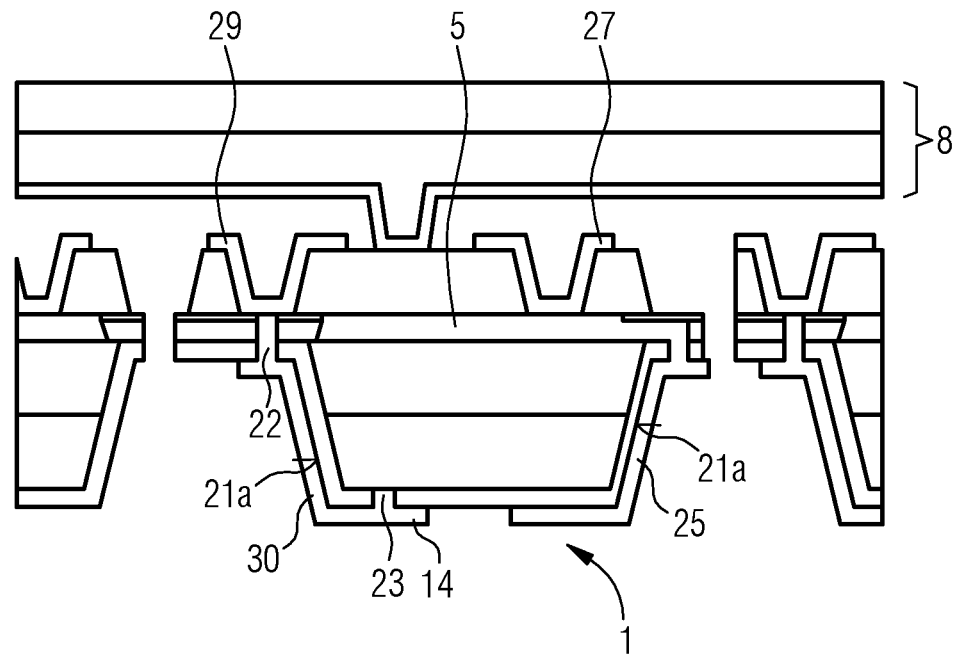

In contrast to the exemplary embodiment of FIG. 22, the radiation-emitting semiconductor chip 1 according to the exemplary embodiment of FIG. 23 comprises first contacts 27.

Figure 24:
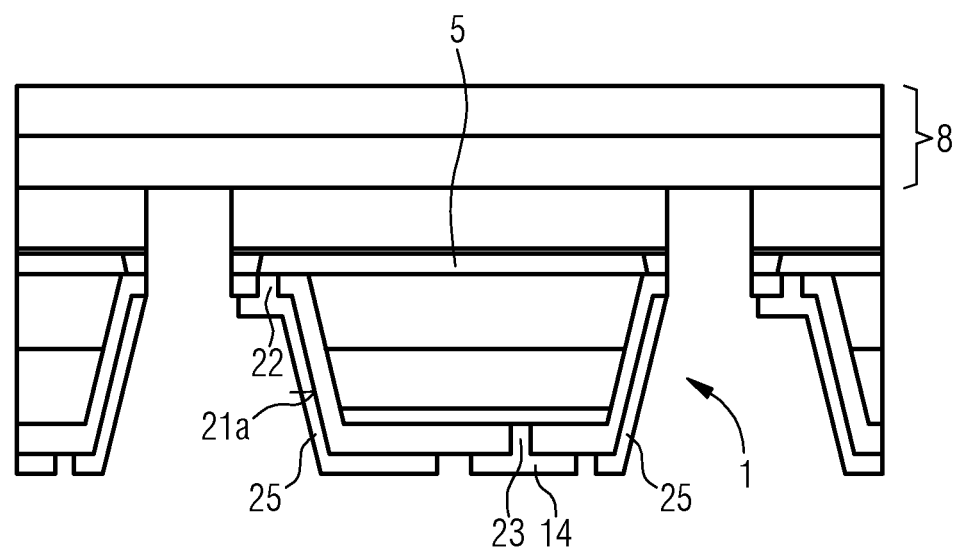
FIG. 24 shows schematic sectional views of a method stage in producing a radiation-emitting semiconductor chip according to an exemplary embodiment.

In the method stage according to the exemplary embodiment of FIG. 24, the radiation-emitting semiconductor chip 1 is mechanically attached to a carrier arrangement 8, in contrast to the method stages according to the exemplary embodiment of FIGS. 15 to 16. Here, the carrier arrangement 8 comprises a second carrier layer 11 and a third carrier layer 12. The second carrier layer 11 is in direct contact with the sacrificial layer 6. Furthermore, the second carrier layer 11 provides a mechanically stable connection between the sacrificial layer 6 and the third carrier layer 12. The radiation-emitting semiconductor chip 1 can be non-destructively detached from the carrier arrangement 8 by laser radiation.

Figure 25:
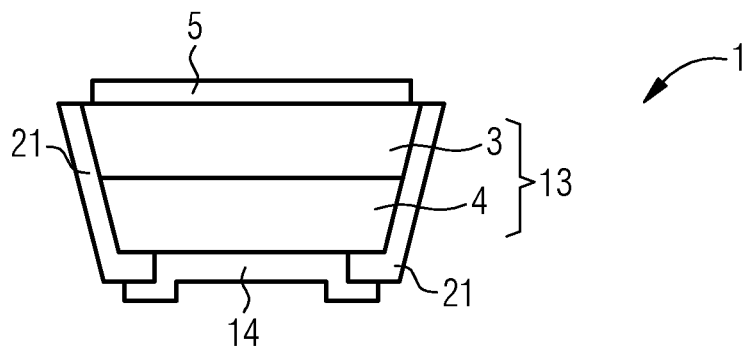
FIGS. 25 and 26 show schematic sectional views of a radiation emitting semiconductor chip according to an exemplary embodiment, respectively.

The radiation-emitting semiconductor chip 1 according to the exemplary embodiment of FIG. 25 comprises a semiconductor body 13 configured to emit electromagnetic radiation. The semiconductor body 13 comprises a first semiconductor layer sequence 3 and a second semiconductor layer sequence 4. A first contact layer 5 is arranged on the first semiconductor layer sequence 3, and a second contact layer 14 is arranged on the second semiconductor layer sequence 4. Furthermore, a side surface of the semiconductor body 13 is completely covered with a passivation layer 21.

In this exemplary embodiment, the radiation-emitting semiconductor chip 1 exclusively comprises components that are formed transparent for the electromagnetic radiation emitted by the semiconductor body 13. Here, the first contact layer 5 and the second contact layer 14 are formed with a transparent conductive material, such as ITO. Furthermore, the passivation layer 21 is formed with silicon dioxide.

Figure 26:
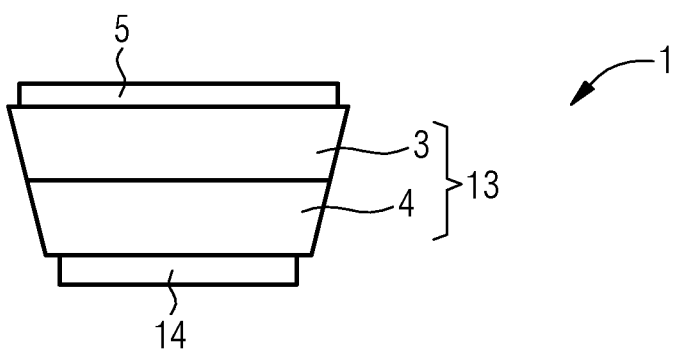

In contrast to the exemplary embodiment of FIG. 25, the radiation-emitting semiconductor chip 1 according to the exemplary embodiment of FIG. 26 does not comprise a passivation layer 21.

Figure 27:
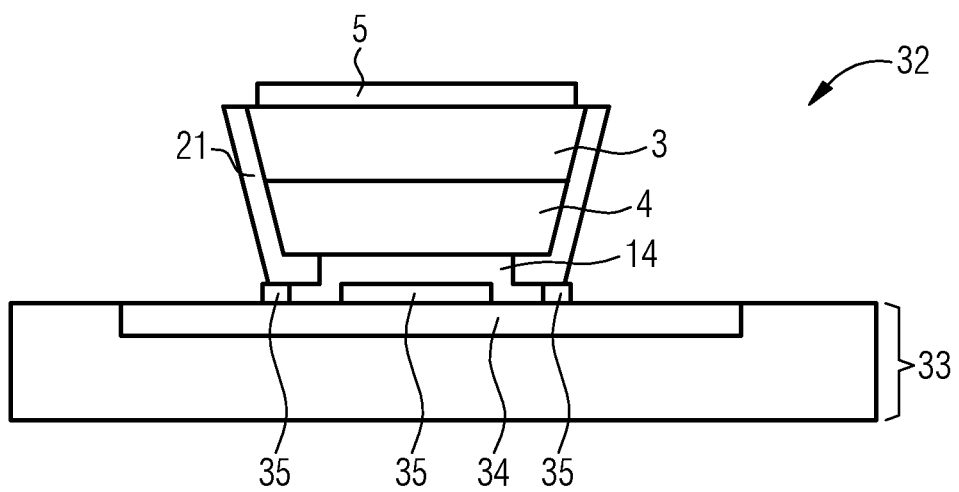
FIGS. 27, 28, 29, 30, 31, and 32 show schematic sectional views of a radiation-emitting device according to an exemplary embodiment, respectively.

The radiation-emitting device 32 according to the exemplary embodiment of FIG. 27 comprises a radiation-emitting semiconductor chip 1 according to the exemplary embodiment of FIG. 25. Here, the semiconductor chip 1 is applied onto a carrier 33, which comprises at least a first contact element 34. In this exemplary embodiment, the radiation-emitting semiconductor chip 1 is arranged with the second contact layer 14 on the first contact element 34 of the carrier 33 by means of an adhesive 35. In this case, the adhesive 35 is an electrically conductive adhesive 35.

Figure 28:
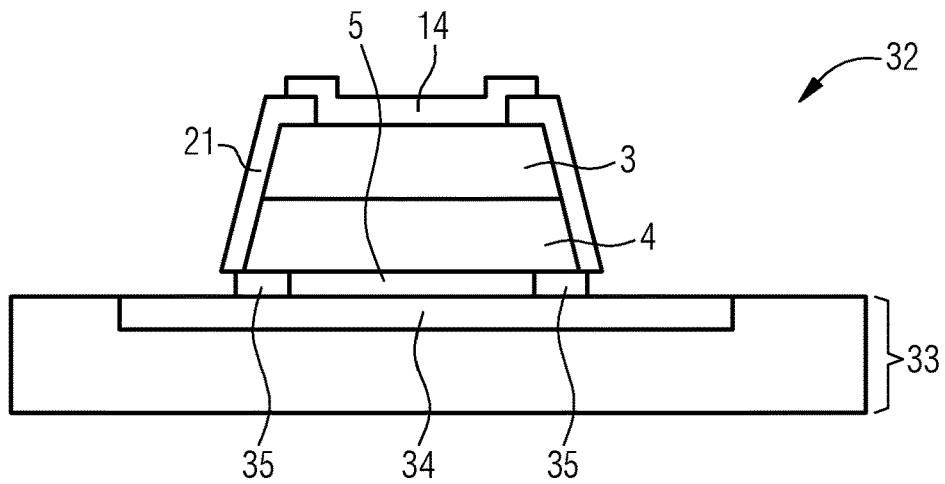

In contrast to the exemplary embodiment of FIG. 27, the radiation-emitting semiconductor chip 1 according to the exemplary embodiment of FIG. 28 is arranged with the first contact layer 5 on the first contact element 34 of the carrier 33 by means of an adhesive 35. In this case, the adhesive 35 is an electrically insulating adhesive 35.

Figure 29:
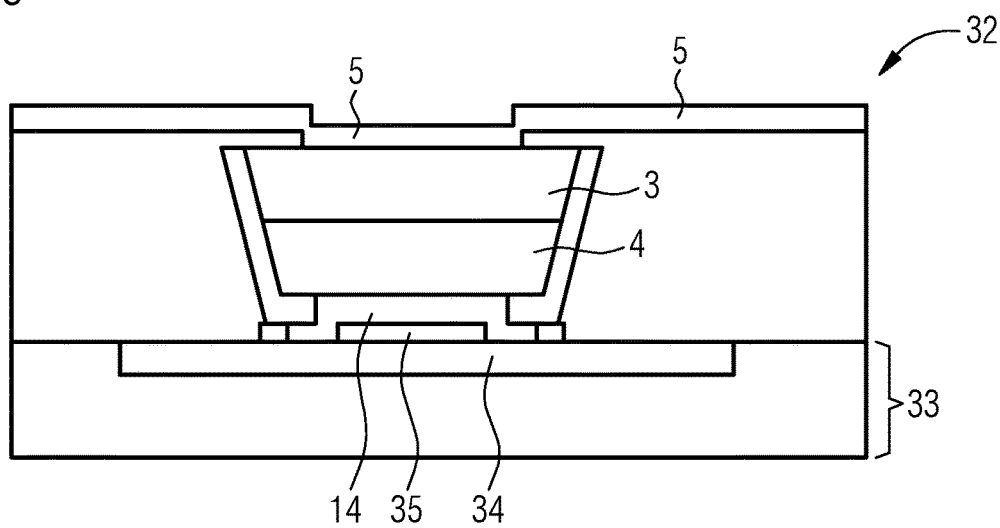

The radiation-emitting device 32 according to the exemplary embodiment of FIG. 29 comprises an enveloping body 37 in contrast to the exemplary embodiment of FIG. 28. The enveloping body 37 is, for example, formed transparent for the radiation generated by the radiation-emitting semiconductor chip 1. The enveloping body 37 may be a resin, such as an epoxy, or a silicone, or a mixture of these materials. Furthermore, a first contact layer 5 also covers a top surface of the enveloping body 37, in particular completely.

Figure 30:
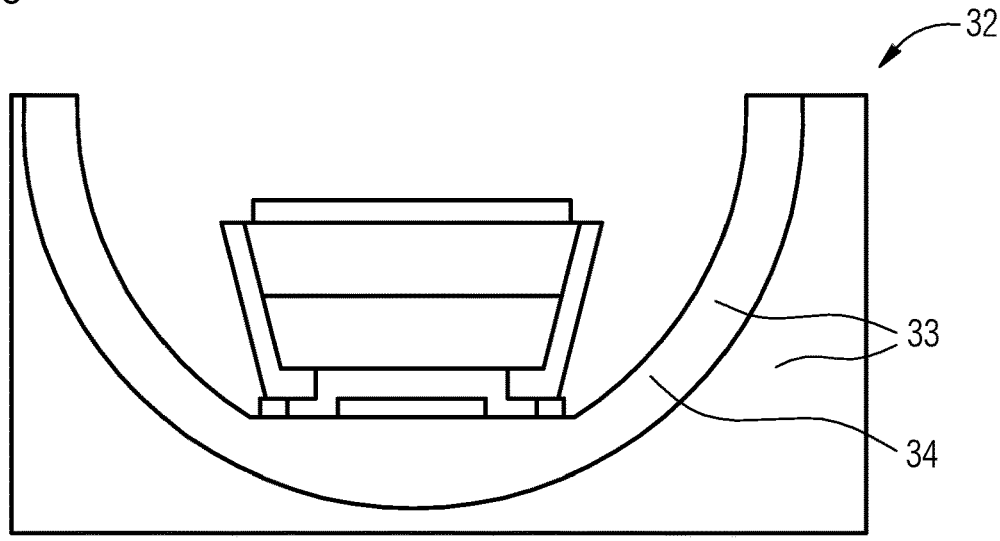

According to the exemplary embodiment of FIG. 30, the first contact element 34 comprises a curved shape, in contrast to the exemplary embodiment of FIG. 28.

In this exemplary embodiment, the first contact element 34 comprises a cavity in which the radiation-emitting semiconductor chip 1 is completely arranged. Further, the radiation-emitting semiconductor chip 1 is completely enclosed by the first contact element 34 in lateral directions.

Figure 31:
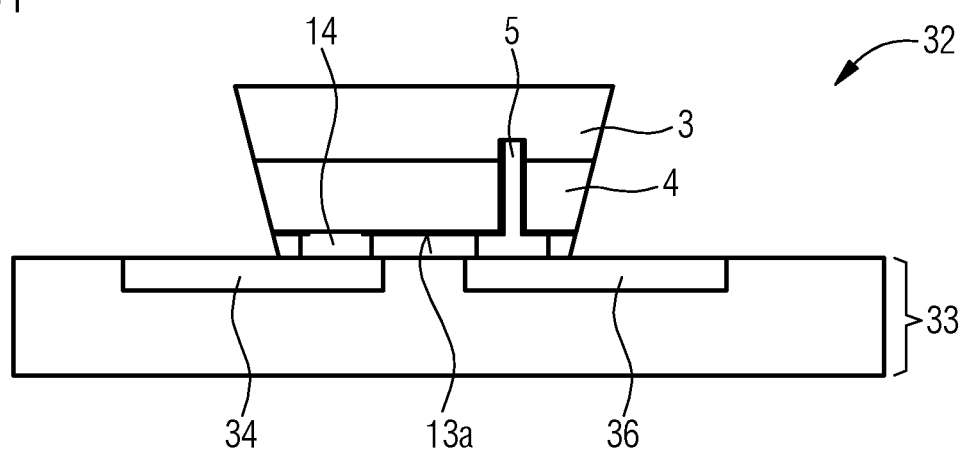

The first contact layer 14 and the second contact layer 5 of the radiation-emitting device 32 are arranged on a bottom surface of the semiconductor body 13, in particular of the second semiconductor layer sequence 4, according to the exemplary embodiment of FIG. 31. Here, the first contact layer 5 extends from the bottom surface of the semiconductor body 13 into the semiconductor body 13 to the first semiconductor layer sequence 3. Furthermore, the first contact layer 14 is arranged on a first contact element 34 and the second contact layer 5 is arranged on a second contact element 36. In this exemplary embodiment, the first contact element 34 and the second contact element 36 comprise a reflective, electrically conductive metal.

Figure 32:
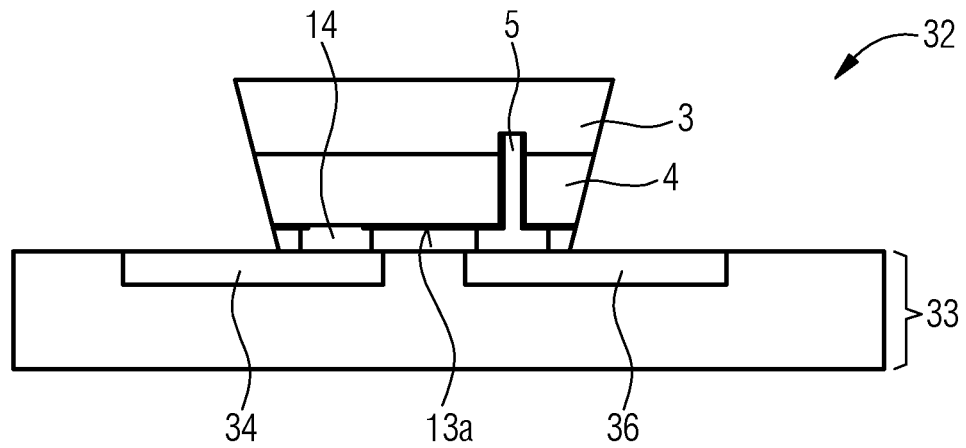

In contrast to the exemplary embodiment of FIG. 31, the first contact element 34 and the second contact element according to the exemplary embodiment of FIG. 32 are formed with a TCO.

The features and embodiments described in connection with the figures may be combined in accordance with further exemplary embodiments, although not all combinations are explicitly described. Furthermore, the exemplary embodiments described in connection with the figures may alternatively or additionally comprise further features according to the description in the general part.

The invention is not limited to the exemplary embodiments by the description based thereon. Rather, the invention encompasses any new feature as well as any combination of features, which in particular includes any combination of features in the patent claims, even if this feature or combination itself is not explicitly specified in the patent claims or exemplary embodiments.

The invention claimed is:

1. A method for producing radiation-emitting semiconductor chips, the method comprising:
   providing a semiconductor wafer;
   applying a first dielectric layer to the semiconductor wafer;
   creating first recesses in the first dielectric layer;
   applying first contact layers on the semiconductor wafer in the first recesses;
   applying a second dielectric layer on the first dielectric layer and the first contact layers;
   forming fourth recesses in the second dielectric layer;
   attaching a carrier arrangement to the semiconductor wafer;
   singulating the semiconductor wafer into semiconductor bodies; and
   applying second contact layers on the semiconductor bodies,
   wherein the second dielectric layer is formed such that it mechanically stabilizes itself, and
   wherein each fourth recess overlaps in lateral directions with one of the first recesses.

2. The method according to claim 1, further comprising:
   forming a sacrificial layer in a single contiguous manner on the semiconductor wafer,
   wherein the carrier arrangement comprises a second carrier layer and a third carrier layer, and
   wherein the second carrier layer is applied to the sacrificial layer.

3. The method according to claim 1, further comprising, after applying the first contact layers, creating a sacrificial layer penetrated by openings on the semiconductor wafer,
   wherein the carrier arrangement is fixed to the sacrificial layer,
   wherein holding elements of the carrier arrangement are each formed in an opening of the sacrificial layer, and
   wherein the sacrificial layer is removed in such a way that the carrier arrangement is mechanically connected to the semiconductor bodies only in a region of the holding elements.

4. The method according to claim 1, further comprising:
   forming fifth recesses spaced apart in the lateral directions from the first recesses in the second dielectric layer; and
   arranging second contacts in each of the fifth recesses.

5. The method according to claim 4, further comprising:
   applying a passivation layer; and
   applying further second contact layers on side surfaces of the passivation layer,
   wherein the second contact layers and the further second contact layers each electrically conductively connect one of the second contacts with a respective one of the exposed semiconductor bodies.

6. The method according to claim 1, further comprising applying a passivation layer over the semiconductor bodies, after singulating the semiconductor wafer.

7. The method according to claim 6, further comprising:
   forming second recesses in the passivation layer, the second recesses being spaced apart in the lateral directions from the semiconductor bodies; and
   forming third recesses, each overlapping in the lateral directions with one of the semiconductor bodies in the passivation layer,
   wherein each of the third recesses exposes a region of one of the semiconductor bodies.

8. The method according to claim 7, wherein each of the second contact layers is applied to one of the exposed semiconductor bodies.

9. The method according to claim 7, further comprising applying further first contact layers on side surfaces of the passivation layer, wherein each of the further first contact layers is electrically conductively connected with one of the first contact layers in a respective one of the second recesses.

10. A radiation emitting semiconductor chip comprising:
    a semiconductor body configured to emit electromagnetic radiation;
    a first contact layer with a first recess;
    a second contact layer;
    a first dielectric layer in the first recess; and
    a second dielectric layer arranged on the first dielectric layer and the first contact layer, wherein the second dielectric layer mechanically stabilizes itself, wherein a current is impressable into the semiconductor body through the first contact layer and the second contact layer, and wherein a fourth recess is arranged in the second dielectric layer, the fourth recess overlapping in lateral directions with the first recess.

11. The radiation emitting semiconductor chip according to claim 10, wherein the first contact layer and the second contact layer comprise a transparent conductive material.

12. The radiation emitting semiconductor chip according to claim 10, wherein the first contact layer is arranged on a bottom surface of the semiconductor body, and wherein the first contact layer extends from the bottom surface of the semiconductor body into the semiconductor body.

13. A radiation emitting device comprising:

the radiation emitting semiconductor chip according to claim 10; and a carrier comprising at least a first contact element, wherein the radiation emitting semiconductor chip is arranged on the carrier by a direct bond connection and/or an adhesive.

14. The radiation emitting device according to claim 13, wherein the carrier and/or the first contact element are configured to be transparent to the electromagnetic radiation emitted by the semiconductor body.

15. The radiation emitting device according to claim 13, wherein the first contact element is configured to be reflective for the electromagnetic radiation emitted by the semiconductor body.

16. The radiation emitting device according to claim 15, wherein the first contact element comprises a curved shape.

* * * * *